(12) United States Patent
Auxier et al.

(10) Patent No.: US 10,226,812 B2
(45) Date of Patent: Mar. 12, 2019

(54) ADDITIVELY MANUFACTURED CORE FOR USE IN CASTING AN INTERNAL COOLING CIRCUIT OF A GAS TURBINE ENGINE COMPONENT

(71) Applicant: United Technologies Corporation, Hartford, CT (US)

(72) Inventors: James Tilsley Auxier, Bloomfield, CT (US); Thomas N Slavens, Moodus, CT (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 14/976,333

(22) Filed: Dec. 21, 2015

(65) Prior Publication Data
US 2017/0173671 A1 Jun. 22, 2017

(51) Int. Cl.
B22C 9/10 (2006.01)
B33Y 10/00 (2015.01)
(Continued)

(52) U.S. Cl.
CPC ............... B22C 9/103 (2013.01); B22C 9/24 (2013.01); B22D 23/06 (2013.01); B22D 27/045 (2013.01); B22F 3/1055 (2013.01); B22F 5/007 (2013.01); B22F 7/02 (2013.01); B33Y 10/00 (2014.12); B33Y 80/00 (2014.12); C30B 1/02 (2013.01);
(Continued)

(58) Field of Classification Search
CPC ............ B22C 9/10; B22C 9/103; B22C 9/108
See application file for complete search history.

(56) References Cited

U.S. PATENT DOCUMENTS 7,520,312 B2   4/2009   Memmen
7,686,065 B2   3/2010   Luczak
(Continued)

FOREIGN PATENT DOCUMENTS

EP   1616642 A1   1/2006
EP   1857199 A1   11/2007
(Continued)

OTHER PUBLICATIONS

European Extended Search Report dated Mar. 10, 2017, issued in the corresponding European Patent Application No. 16205980.2.
(Continued)

Primary Examiner — Kevin E Yoon
Assistant Examiner — Jacky Yuen
(74) Attorney, Agent, or Firm — Bachman & LaPointe, P.C.

(57) ABSTRACT

A core for use in casting an internal cooling circuit within a gas turbine engine component includes an additively manufactured skeleton core portion manufactured of a refractory metal, a surround core portion that at least partially encapsulates the additively manufactured skeleton core portion, the surround core portion manufactured of a ceramic material, a surround core portion that at least partially encapsulates the additively manufactured skeleton core portion, the surround core portion manufactured of a ceramic material and a cooling hole shape that extends from the additively manufactured skeleton core portion through the surround core portion, the cooling hole shape operable to form a cooling hole.

14 Claims, 9 Drawing Sheets

(51) Int. Cl.
*B33Y 80/00* (2015.01)
*B22C 9/24* (2006.01)
*B22F 3/105* (2006.01)
*B22F 5/00* (2006.01)
*B22F 7/02* (2006.01)
*B22D 23/06* (2006.01)
*B22D 27/04* (2006.01)
*C30B 1/02* (2006.01)
*B22F 7/08* (2006.01)
*B28B 1/00* (2006.01)
*B28B 7/34* (2006.01)

(52) U.S. Cl.
CPC ............... *B22F 7/08* (2013.01); *B28B 1/001* (2013.01); *B28B 7/346* (2013.01); *Y02P 10/292* (2015.11)

(56) References Cited

U.S. PATENT DOCUMENTS

| | | | |
|---|---|---|---|
| 7,753,104 B2 | 7/2010 | Luczak et al. | |
| 8,113,780 B2 | 2/2012 | Cherolis et al. | |
| 8,157,504 B2 | 4/2012 | Amaral et al. | |
| 8,261,810 B1 | 9/2012 | Liang | |
| 8,813,812 B2 * | 8/2014 | Kamel | B22C 9/103 164/28 |
| 9,243,502 B2 | 1/2016 | Xu | |
| 2003/0223862 A1 | 12/2003 | Demarche et al. | |
| 2004/0076519 A1 | 4/2004 | Halfmann et al. | |
| 2004/0115053 A1 | 6/2004 | Shi et al. | |
| 2007/0128032 A1 | 6/2007 | Lee et al. | |
| 2007/0237639 A1 | 10/2007 | Cunha et al. | |
| 2008/0056908 A1 | 3/2008 | Morris et al. | |
| 2008/0101961 A1 | 5/2008 | Liang et al. | |
| 2008/0131285 A1 * | 6/2008 | Albert | B22C 9/04 416/96 R |
| 2008/0138209 A1 | 6/2008 | Cunha et al. | |
| 2008/0164001 A1 | 7/2008 | Morris et al. | |
| 2009/0317234 A1 | 12/2009 | Zausner et al. | |
| 2010/0008761 A1 | 1/2010 | Piggush et al. | |
| 2012/0269649 A1 | 10/2012 | Rawlings et al. | |
| 2013/0026338 A1 * | 1/2013 | Castle | B22C 9/04 249/114.1 |
| 2013/0266816 A1 * | 10/2013 | Xu | B33Y 10/00 428/450 |
| 2013/0280081 A1 * | 10/2013 | Propheter-Hinckley | F01D 5/187 416/223 R |
| 2014/0102656 A1 * | 4/2014 | Propheter-Hinckley | B22C 9/04 164/34 |
| 2014/0199177 A1 * | 7/2014 | Propheter-Hinckley | F01D 5/187 416/97 R |
| 2015/0306657 A1 * | 10/2015 | Frank | B22C 9/24 164/23 |

FOREIGN PATENT DOCUMENTS

| | | |
|---|---|---|
| EP | 1914030 A1 | 4/2008 |
| EP | 2191910 A1 | 6/2010 |
| WO | 2013163029 A1 | 10/2013 |
| WO | 2014011262 A2 | 1/2014 |
| WO | WO-2015009448 A1 * | 1/2015 ............. F01D 5/147 |
| WO | 2015050987 A1 | 4/2015 |

OTHER PUBLICATIONS

European Office Action dated Aug. 10, 2018 issued in the corresponding European Patent Application No. 16205980.2.

* cited by examiner

ADDITIVELY MANUFACTURED CORE FOR USE IN CASTING AN INTERNAL COOLING CIRCUIT OF A GAS TURBINE ENGINE COMPONENT

BACKGROUND

The present disclosure relates to additive manufacturing and, more particularly, to a core with an additively manufactured portion for use in casting an internal cooling circuit within a gas turbine engine component.

Gas turbine engines typically include a compressor section to pressurize airflow, a combustor section to burn a hydrocarbon fuel in the presence of the pressurized air, and a turbine section to extract energy from the resultant combustion gases. Gas path components, such as turbine blades, often include airfoil cooling that may be accomplished by external film cooling, internal air impingement, and forced convection either separately or in combination.

One way to improve airfoil cooling efficiency is by increasing the pressure and temperature of the compressed and combusted air, from which the turbine extracts work. Thus, more highly-evolved turbines see ever-increasing gaspath and cooling air temperatures, which may present a challenge as the gaspath temperatures often exceed the incipient melting temperatures of the airfoils', combustor liners', and BOAS' constituent alloys. Complex internal cooling schemes must be relied upon to supply convective cooling and source film cooling, which are most often produced by investment casting of superalloys with ceramic cores. The film cooling holes are later subtractively drilled through a variety of methods, which on high pressure airfoils, may number between 10 and 300.

Cast-in cooling holes have been demonstrated in single crystal, at least on flat plates, and have not exhibited significant signs of recrystallization. But there are issues with the process. The fragility of ceramic cores, whether traditionally made through injection or molding, or via ceramic additive manufacturing, does not lend itself to the casting of cooling holes which may be as small as 0.014" in diameter for some portion of the hole. Insertion of a multitude of quartz/alumina rods (which are stronger) or refractory metal pins into a ceramic core (either pre- or post-injection) is not a producible concept, either, as this quickly becomes cost and time prohibitive and is likely not a repeatable process for shaped holes.

SUMMARY

A core for use in casting an internal cooling circuit within a gas turbine engine component according to one disclosed non-limiting embodiment of the present disclosure can include an additively manufactured skeleton core portion; and a surround core portion that at least partially encapsulates the additively manufactured skeleton core portion.

A further embodiment of the present disclosure may include, wherein the additively manufactured skeleton core portion is manufactured of a first material and the surround core portion is manufactured of a second material, the first material different than the second material.

A further embodiment of the present disclosure may include, wherein the additively manufactured skeleton core portion is manufactured of a refractory metal.

A further embodiment of the present disclosure may include, wherein the additively manufactured skeleton core portion is manufactured of Molybdenum.

A further embodiment of the present disclosure may include, wherein the additively manufactured skeleton core portion is manufactured of aluminum oxide.

A further embodiment of the present disclosure may include, wherein the additively manufactured skeleton core portion is manufactured of silicon dioxide.

A further embodiment of the present disclosure may include, wherein the surround core portion is additively manufactured onto the additively manufactured skeleton core portion.

A further embodiment of the present disclosure may include, wherein the surround core portion is molded onto the additively manufactured skeleton core portion.

A further embodiment of the present disclosure may include a cooling hole shape that extends form the additively manufactured skeleton core portion, the cooling hole shape operable to form cooling hole.

A further embodiment of the present disclosure may include an external fixation to connect at least two pedestals of the cooling hole shapes.

A method of manufacturing a core for use in casting an internal cooling circuit within a gas turbine engine component according to another disclosed non-limiting embodiment of the present disclosure can include at least partially encapsulating an additively manufactured skeleton core portion with a surround core portion.

A further embodiment of the present disclosure may include additively manufacturing the surround core portion.

A further embodiment of the present disclosure may include manufacturing the additively manufactured skeleton core portion of a first material and the surround core portion of a second material, the first material different than the second material.

A further embodiment of the present disclosure may include additively manufacturing a cooling hole shape that extends from the additively manufactured skeleton core portion, the cooling hole shape operable to form cooling holes.

A further embodiment of the present disclosure may include additively manufacturing an external fixation to connect at least two pedestals of the cooling hole shapes.

A further embodiment of the present disclosure may include forming a diffusion region to the cooling hole shape.

A further embodiment of the present disclosure may include additively manufacturing the additively manufactured skeleton core portion from a refractory metal.

A further embodiment of the present disclosure may include additively manufacturing the additively manufactured skeleton core portion from Molybdenum.

A further embodiment of the present disclosure may include molding the surround core portion.

A further embodiment of the present disclosure may include injecting ceramic material into a core die to form the surround core portion.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
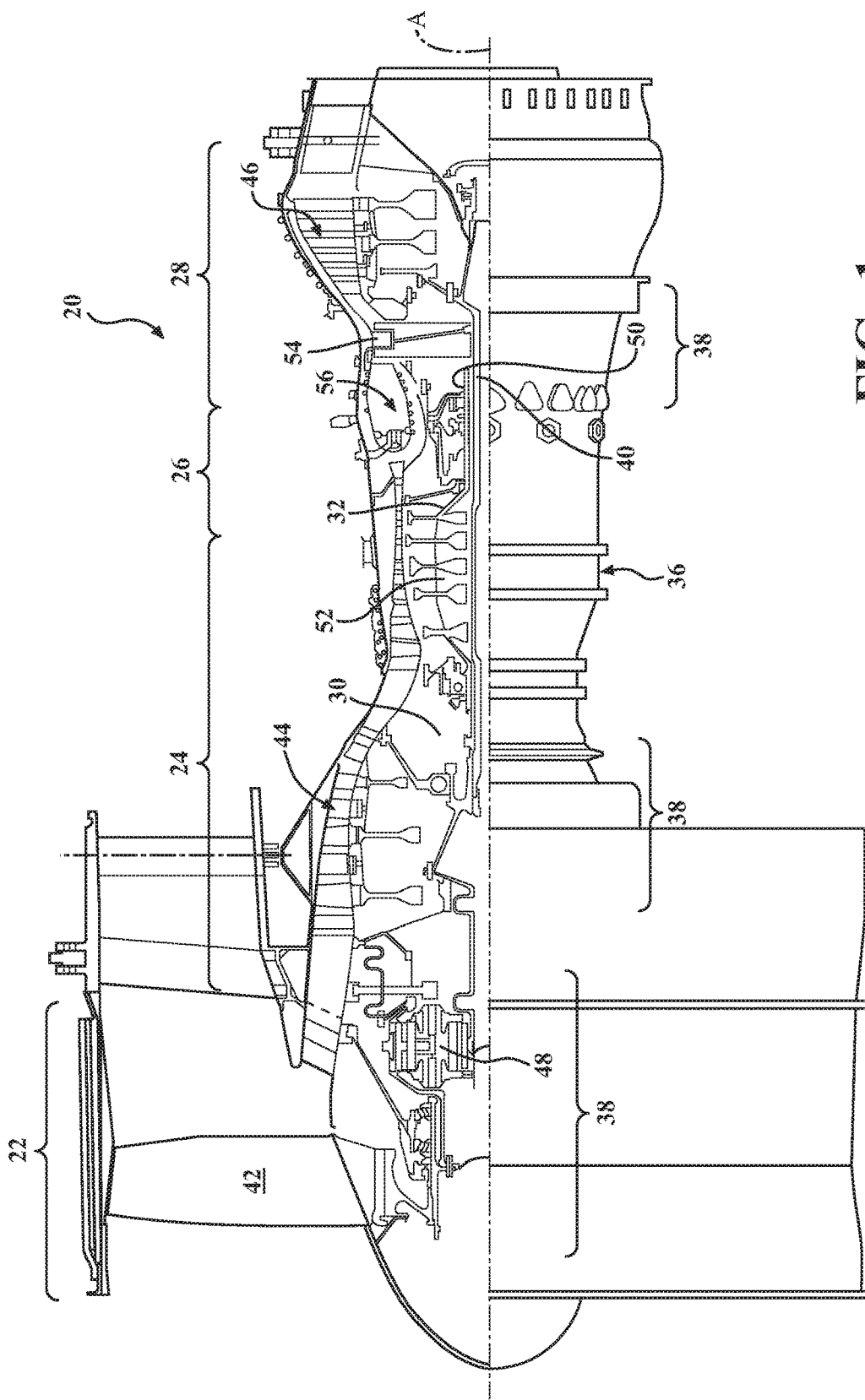
FIG. 1 is a schematic cross-section of an example gas turbine engine architecture.

FIG. 1 schematically illustrates a gas turbine engine 20. The gas turbine engine 20 is disclosed herein as a two-spool turbo fan that generally incorporates a fan section 22, a compressor section 24, a combustor section 26 and a turbine section 28. The fan section 22 drives air along a bypass flowpath while the compressor section 24 drives air along a core flowpath for compression and communication into the combustor section 26 then expansion through the turbine section 28. Although depicted as a turbofan in the disclosed non-limiting embodiment, it should be understood that the concepts described herein are not limited to use with turbofans as the teachings may be applied to other types of turbine engine architectures such as turbojets, turboshafts, and three-spool (plus fan) turbofans.

The engine 20 generally includes a low spool 30 and a high spool 32 mounted for rotation about an engine central longitudinal axis X relative to an engine static structure 36 via several bearing structures 38. The low spool 30 generally includes an inner shaft 40 that interconnects a fan 42, a low pressure compressor ("LPC") 44 and a low pressure turbine ("LPT") 46. The inner shaft 40 drives the fan 42 directly or through a geared architecture 48 to drive the fan 42 at a lower speed than the low spool 30. An exemplary reduction transmission is an epicyclic transmission, namely a planetary or star gear system.

The high spool 32 includes an outer shaft 50 that interconnects a high pressure compressor ("HPC") 52 and high pressure turbine ("HPT") 54. A combustor 56 is arranged between the high pressure compressor 52 and the high pressure turbine 54. The inner shaft 40 and the outer shaft 50 are concentric and rotate about the engine central longitudinal axis X which is collinear with their longitudinal axes.

Core airflow is compressed by the LPC 44 then the HPC 52, mixed with the fuel and burned in the combustor 56, then expanded over the HPT 54 and the LPT 46. The turbines 54, 46 rotationally drive the respective low spool 30 and high spool 32 in response to the expansion. The main engine shafts 40, 50 are supported at a plurality of points by bearing structures 38 within the static structure 36. It should be understood that various bearing structures 38 at various locations may alternatively or additionally be provided.

Figure 2:
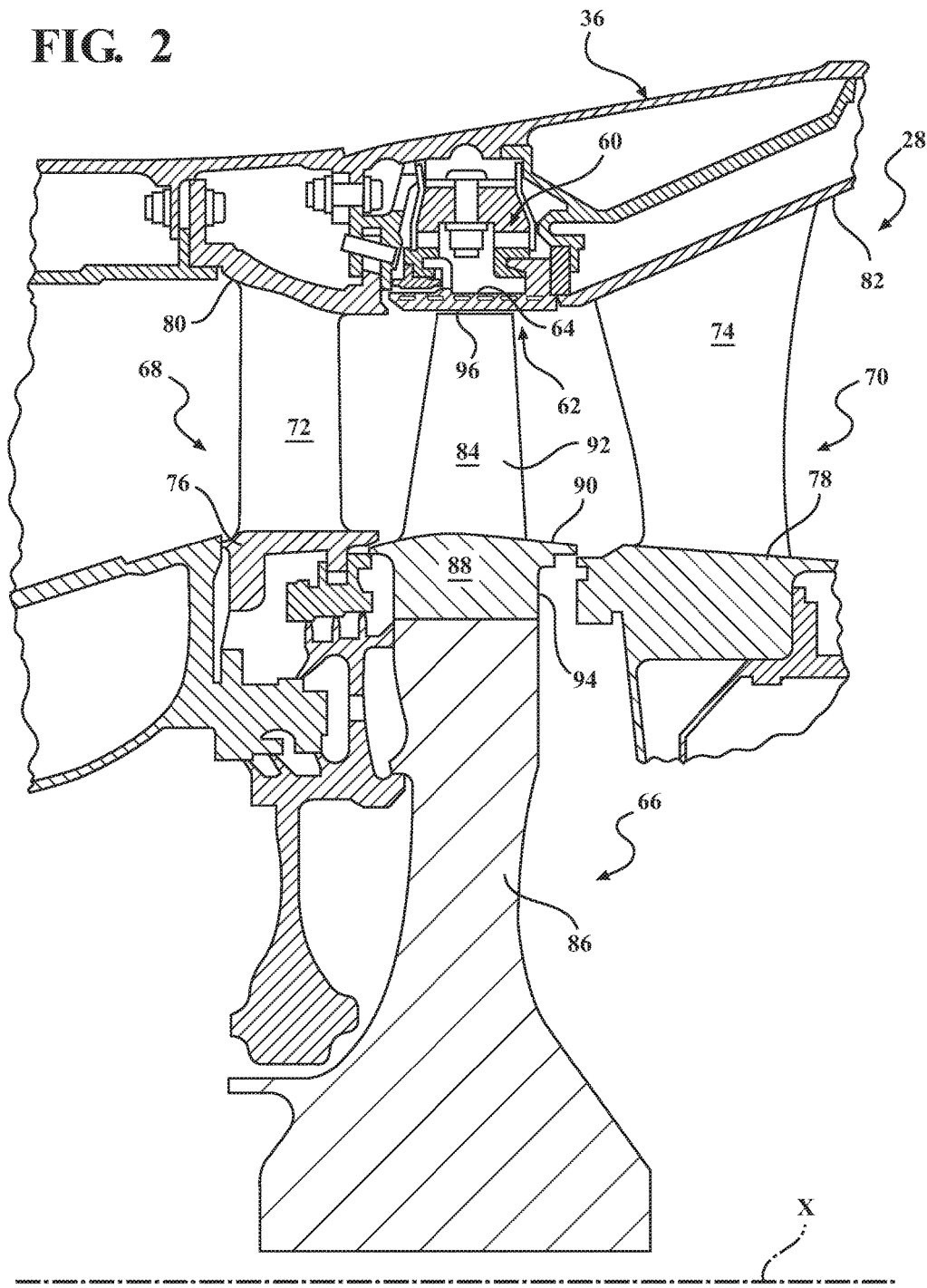
FIG. 2 is an enlarged schematic cross-section of an engine turbine section.

With reference to FIG. 2, an enlarged schematic view of a portion of the turbine section 28 is shown by way of example; however, other engine sections will also benefit herefrom. A full ring shroud assembly 60 within the engine case structure 36 supports a blade outer air seal (BOAS) assembly 62 with a multiple of circumferentially distributed BOAS 64 proximate to a rotor assembly 66 (one schematically shown).

The full ring shroud assembly 60 and the BOAS assembly 62 are axially disposed between a forward stationary vane ring 68 and an aft stationary vane ring 70. Each vane ring 68, 70 includes an array of vanes 72, 74 that extend between a respective inner vane platform 76, 78 and an outer vane platform 80, 82. The outer vane platforms 80, 82 are attached to the engine case structure 36.

The rotor assembly 66 includes an array of blades 84 circumferentially disposed around a disk 86. Each blade 84 includes a root 88, a platform 90 and an airfoil 92 (also shown in FIG. 3). The blade roots 88 are received within a rim 94 of the disk 86 and the airfoils 92 extend radially outward such that a tip 96 of each airfoil 92 is closest to the blade outer air seal (BOAS) assembly 62. The platform 90 separates a gas path side inclusive of the airfoil 92 and a non-gas path side inclusive of the root 88.

Figure 3:
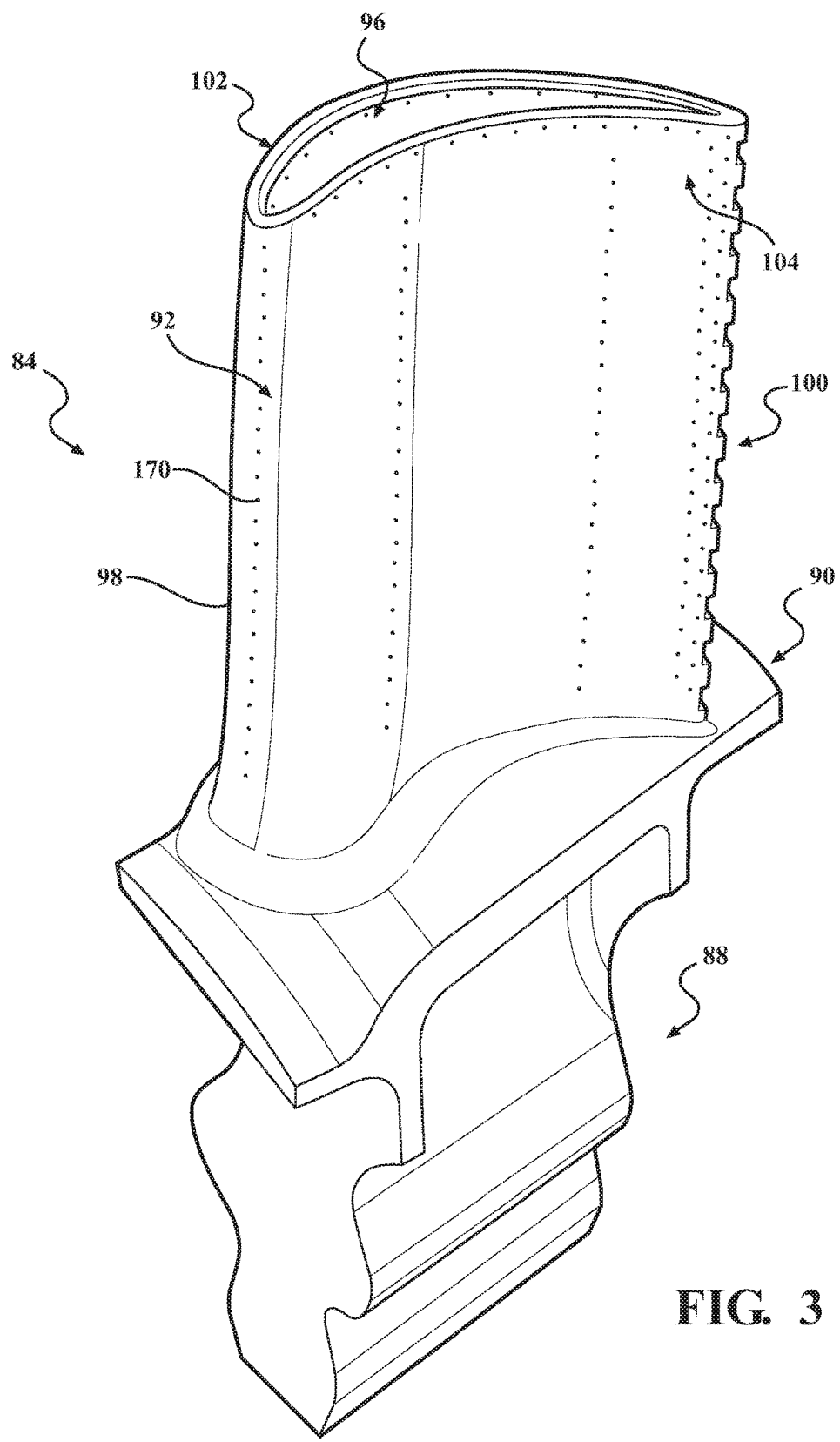
FIG. 3 is a perspective view of an airfoil as an example component.

With reference to FIG. 3, the platform 90 generally separates the root 88 and the airfoil 92 to define an inner boundary of a gas path. The airfoil 92 defines a blade chord between a leading edge 98, which may include various forward and/or aft sweep configurations, and a trailing edge 100. A first sidewall 102 that may be convex to define a suction side, and a second sidewall 104 that may be concave to define a pressure side are joined at the leading edge 98 and at the axially spaced trailing edge 100. The tip 96 extends between the sidewalls 102, 104 opposite the platform 90. It should be appreciated that the tip 96 may include a recessed portion.

Figure 4:
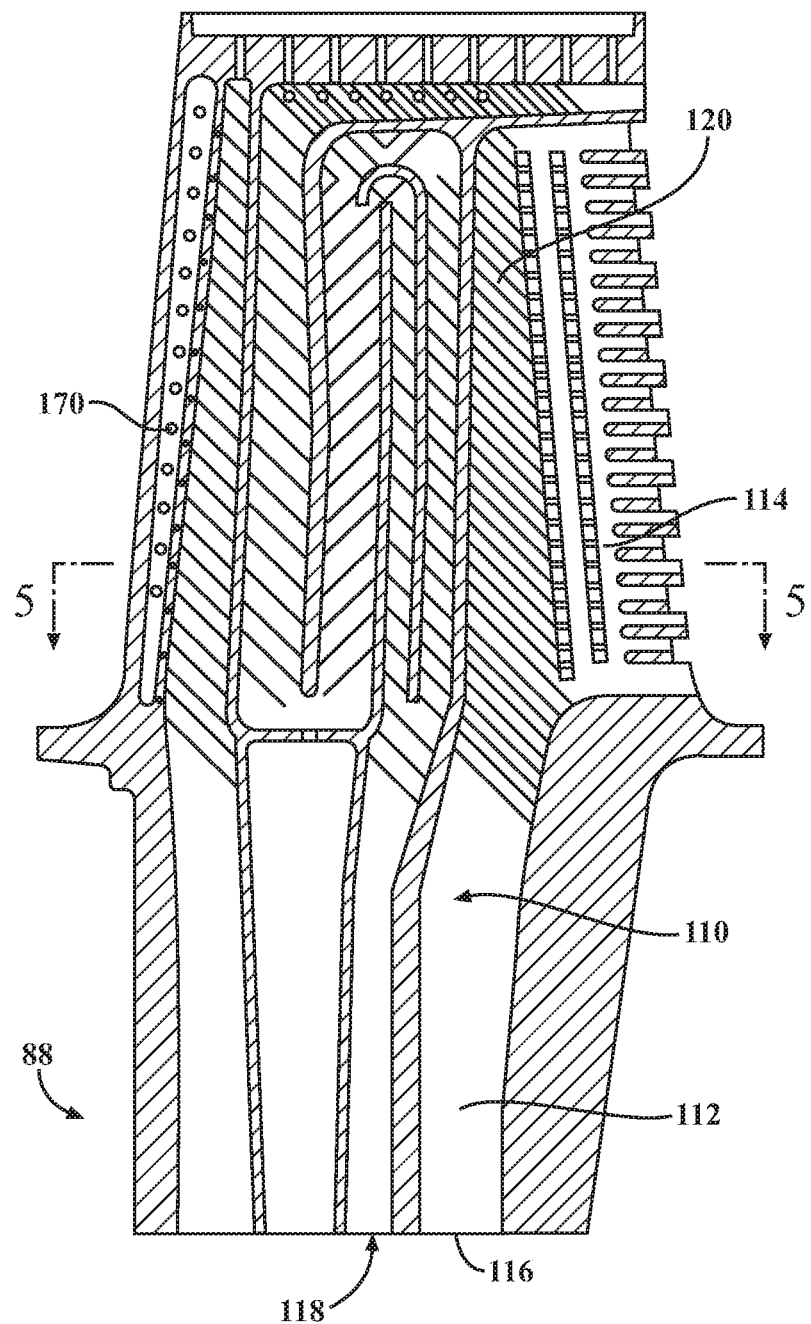
FIG. 4 is a schematic cross-section view of the airfoil of FIG. 4 showing the internal architecture.

To resist the high temperature stress environment in the gas path of a turbine engine, each blade 84 may be formed by casting. It should be appreciated that although a blade 84 with an internal cooling circuit 110 (shown schematically; FIG. 4) will be described and illustrated in detail, other hot section components including, but not limited to, vanes, turbine shrouds, end walls, and other such components will also benefit here from.

With reference to FIG. 4, the internal cooling circuit 110 may include a feed passage 112 that communicates airflow into a trailing edge cavity 114 within the airfoil 84. It should be appreciated that the internal cooling circuit 110 may be of various geometries, and include various features. The feed passage 112 in this embodiment is the aft most passage that communicates cooling air to the trailing edge cavity 114. The feed passage 112 generally receives cooling flow through at least one inlet 116 within the base 118 of the root 88. It should be appreciated that various feed architecture; cavities, and passageway arrangements will benefit herefrom.

The tip 96 and the trailing edge 100 bound the trailing edge cavity 114 between the sidewalls 102, 104. The trailing edge cavity 114 includes a multiple of features 120. The features 120 in this disclosed non-limiting embodiment may include a multiple of pedestals, a multiple of strips, and a multiple of edge features. It should be appreciated that although particular features are delineated within certain general areas, the features may be otherwise arranged or intermingled and still not depart from the disclosure herein.

Figure 5:
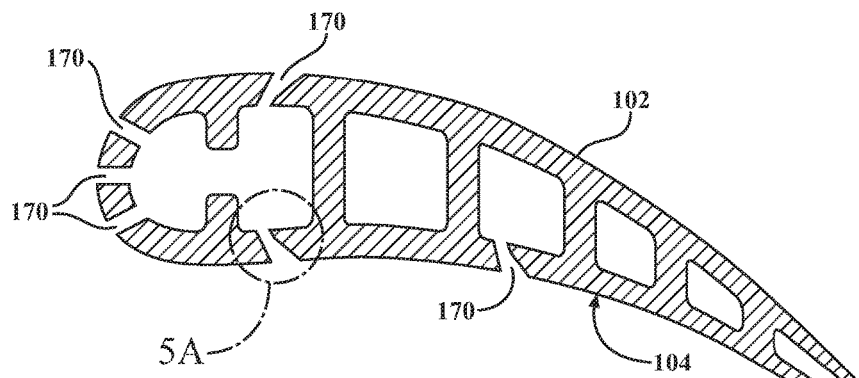
FIG. 5 is a lateral sectional view of the airfoil of FIG. 4.
Figure 5A:
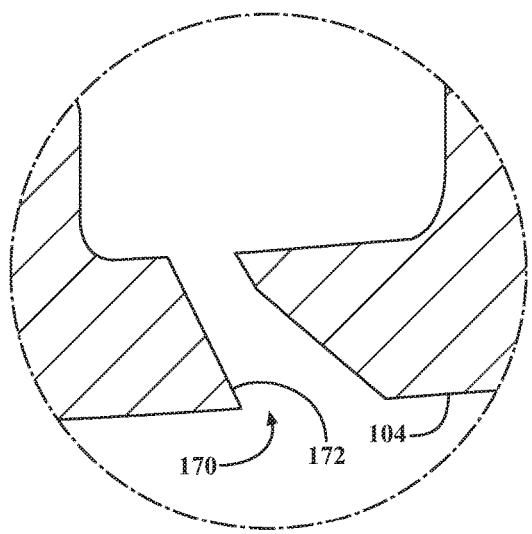
FIG. 5A is an expanded lateral sectional view of a cooling passage in the airfoil of FIG. 5.

A multiple of cooling holes 170, e.g., showerhead, platform, tip, etc., communicates the cooling airflow from the internal cooling circuit 110 through the wall of the blade 84 to provide external film cooling allowing exits of internal cooling flow used in forced convection of the blade. In some examples, one or more of the multiple of cooling holes 170 are shaped cooling holes that include a diffuser shape 172 that may be angled with regard the sidewall 102, 104 of the blade 84 (FIG. 5).

Figure 6:
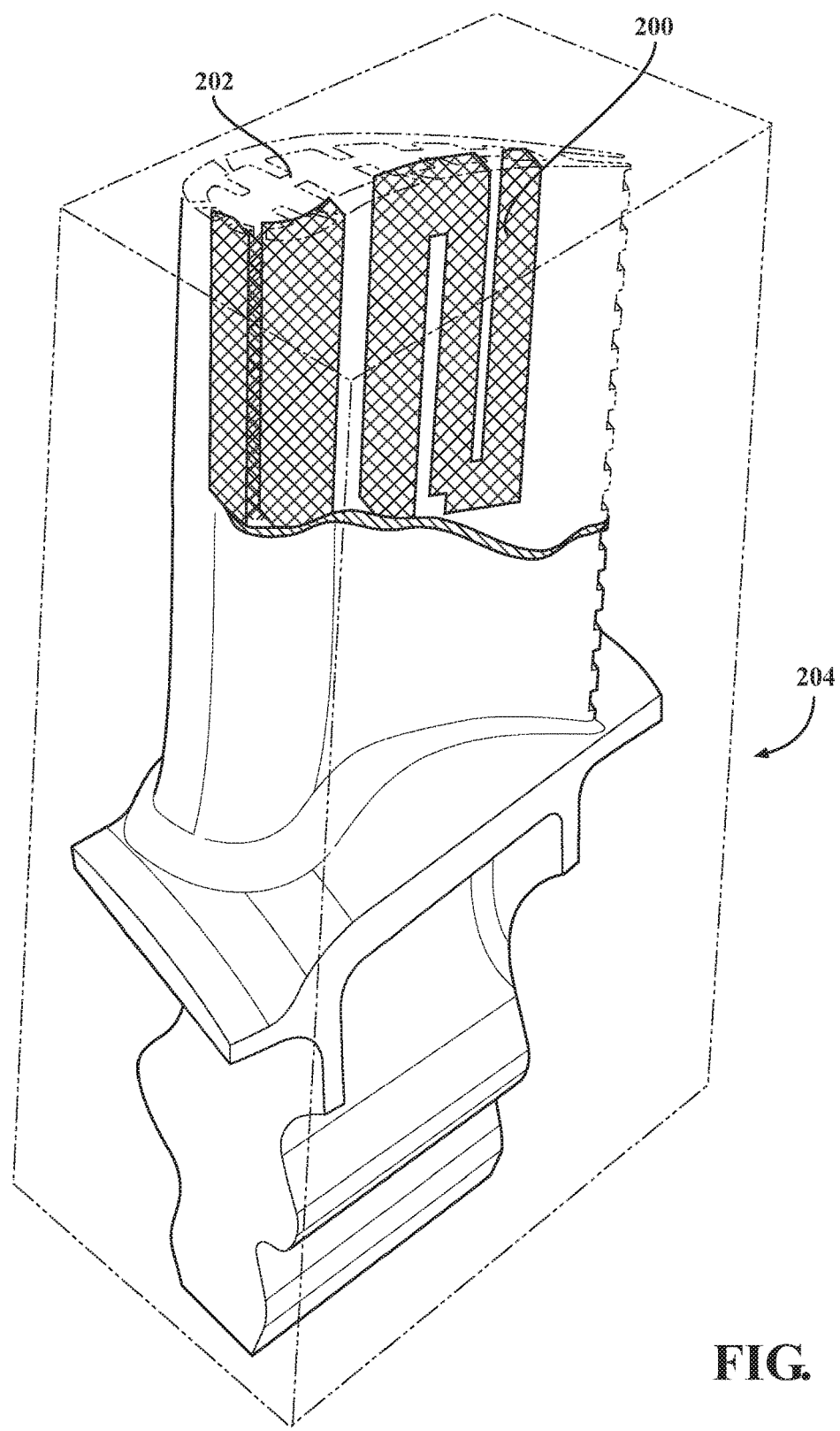
FIG. 6 is a schematic partial fragmentary view of a mold with ceramic core that is additively manufactured according to another disclosed process for casting of an airfoil.

Generally, to form the internal cooling circuit 110, a core 200 is positioned within a shell 202 (FIG. 6). The shell 202 defines the outer surface of the blade 84 while the core 200 forms the internal surfaces such as that which defines the internal cooling circuit 110 (FIG. 4). That is, during the casting process, the core 200 fills a selected volume within the shell 202 that, when removed from the finished blade casting, defines the internal cooling circuit 110 utilized for cooling airflow.

The shell 202 and the core 200 together define a mold 204 to cast the complex exterior and interior geometries that may be formed of refractory metals, ceramic, or hybrids thereof. The mold 204 operates as a melting unit and/or a die for a desired material that forms the blade 84. The desired material may include, but not be limited to, a super alloy or other material such as nickel based super alloy, cobalt based super alloy, iron based super alloy, and mixtures thereof that is melted; a molten super alloy that is then solidified; or other material. In another non-limiting embodiment, the crucible may be directly filled with a molten super alloy.

Alternatively, or in addition, a single crystal starter seed or grain selector may be utilized to enable a single crystal to form when solidifying the component. The solidification may utilize a chill block in a directional solidification furnace. The directional solidification furnace has a hot zone that may be induction heated and a cold zone separated by an isolation valve. The chill block and may be elevated into the hot zone and filled with molten super alloy. After the pour, or being molten, the chill plate may descend into the cold chamber causing a solid/liquid interface to advance from the partially molten starter seed in the form of a single crystallographic oriented component whose orientation is dictated by the orientation of the starter seed. Casting is typically performed under an inert atmosphere or vacuum to preserve the purity of the casting.

Following solidification, the shell 202 is broken away and the core 200 may be removed from the solidified component by, for example, caustic leaching, to leave the finished single crystal component. After removal, machining, surface treating, coating, or any other desirable finishing operation may be performed to further finish the component.

Figure 7:
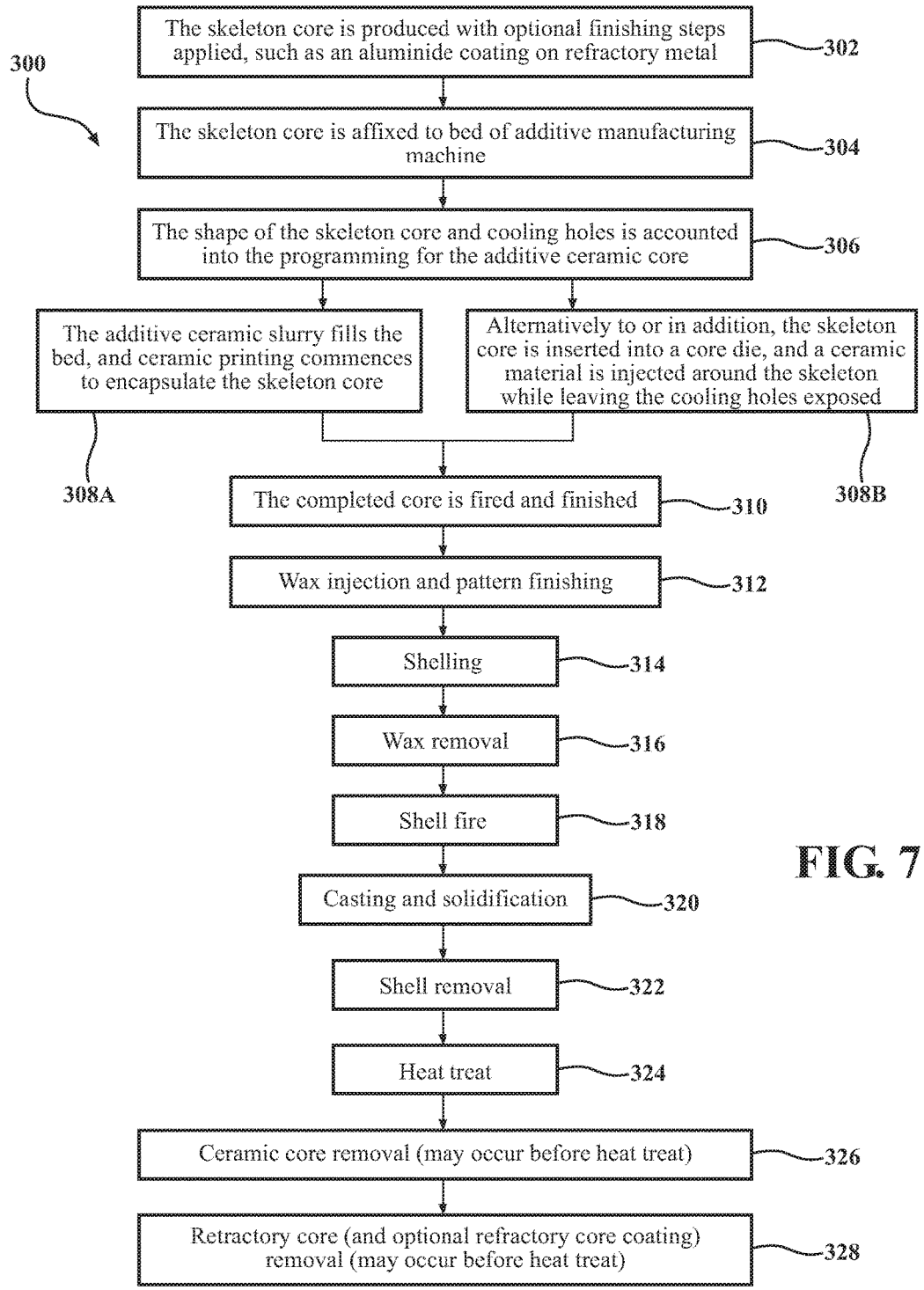
FIG. 7 is a method to at least partially additively manufacture a core according to one disclosed non-limiting embodiment.
Figure 8:
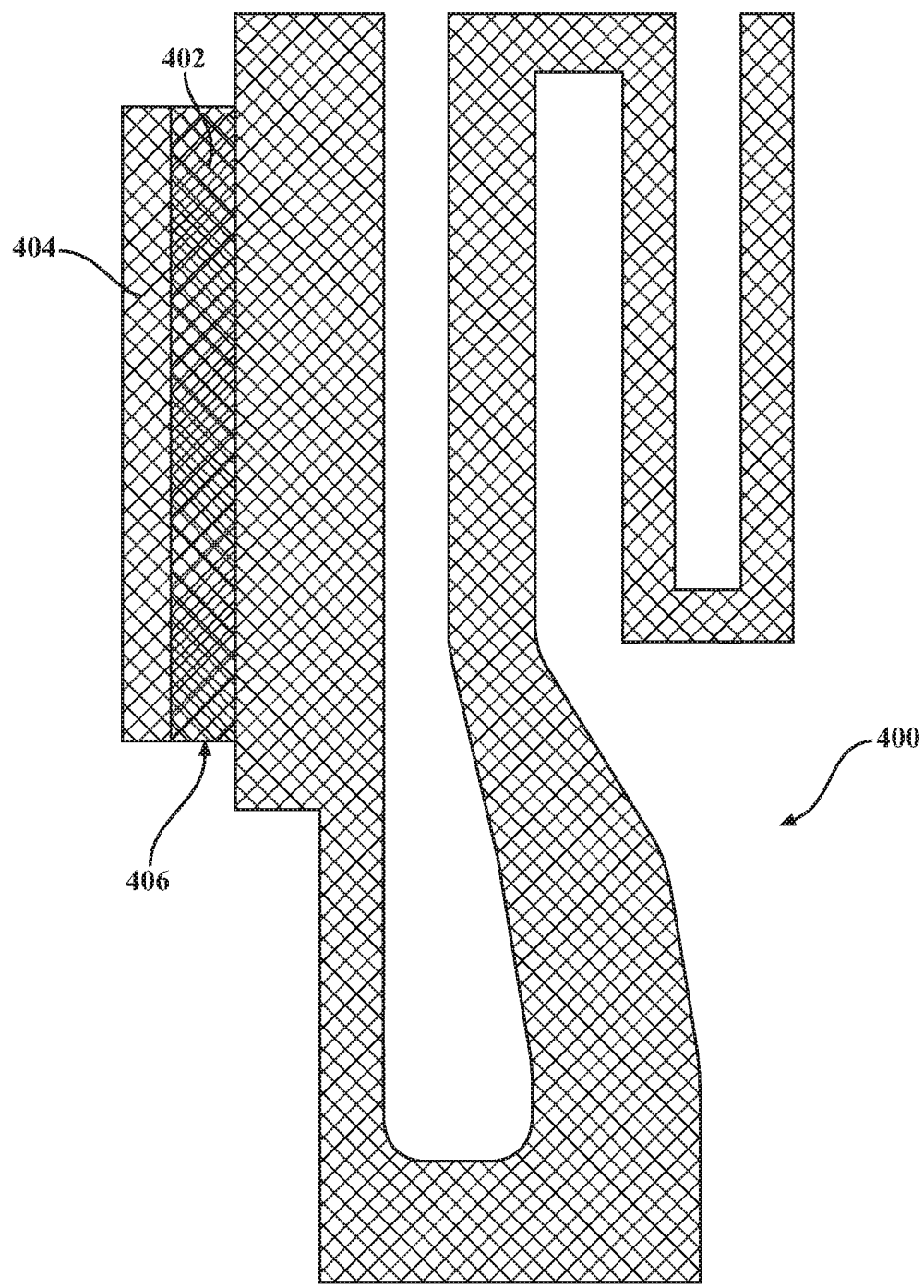
FIG. 8 is a perspective view of a core with an additively manufactured portion.
Figure 9:
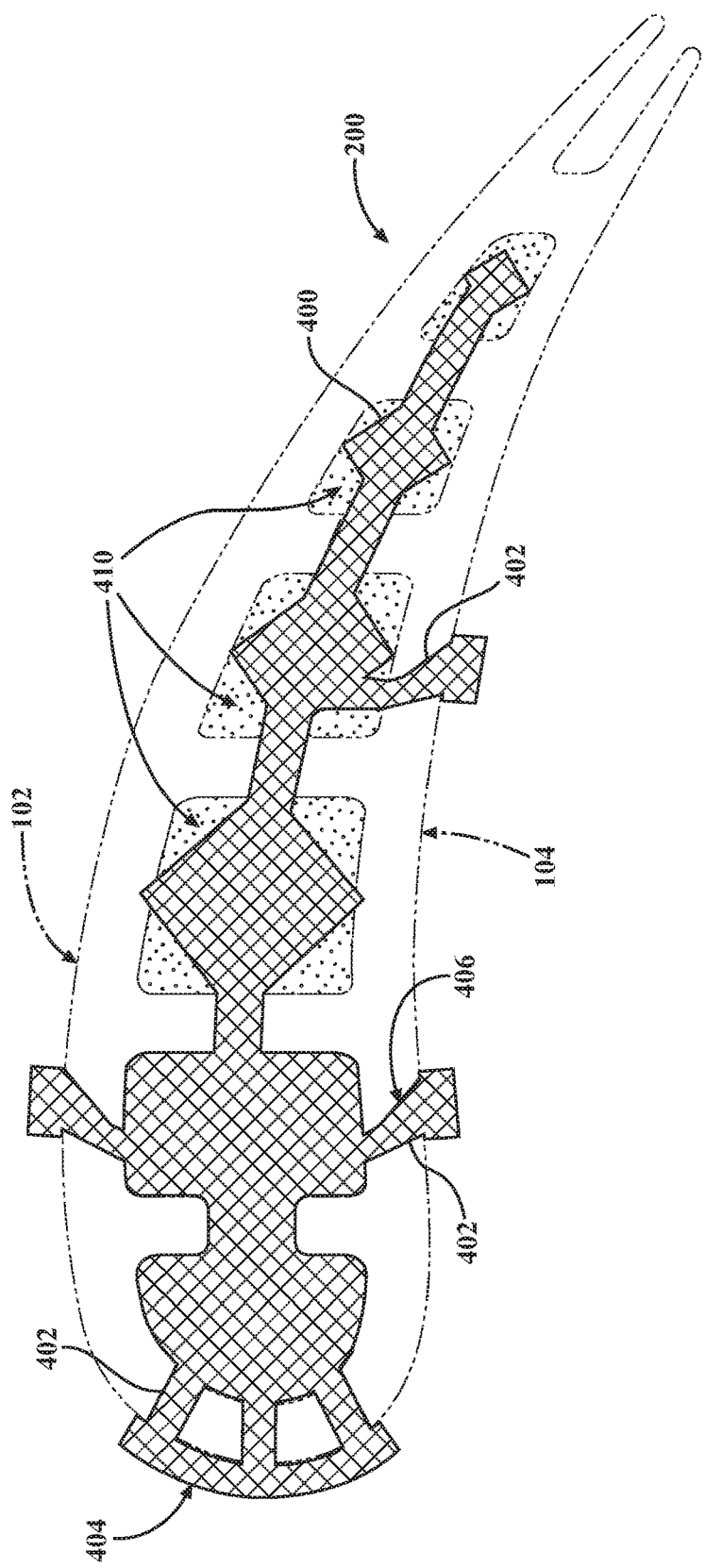
FIG. 9 is an expanded sectional view of an additively manufactured core feature features according to another disclosed non-limiting embodiment.

With reference to FIG. 7, one disclosed non-limiting embodiment of a method 300 to manufacture the core 200 initially includes manufacture of an additively manufactured skeleton core portion 400 (FIG. 8). The additively manufactured skeleton core portion 400 may be a semi-finished additively-manufactured extra-resilient skeleton of a refractory metal, such as Molybdenum or aluminum oxide, as well as other materials such as quartz, replete with all the desired cooling hole shapes 402, e.g., showerhead, PS, SS, platform, tip, shapes attached thereto (step 302; FIGS. 8 and 9). That is, the cooling hole shapes 402 include a multiple of posts 406 that are positive structure, which, once the shell 202 is broken away and the core 200 removed, form the cooling holes 170 in the blade 84 (FIG. 5). That is, the material formed around the cooling hole shapes 402 form the cooling holes 170 once the cooling hole shapes 402 are removed.

The cooling hole shapes 402 are additively manufactured and integral to the additively manufactured skeleton core portion 400. The cooling hole shapes 402 may include external fixation 404 that connect the multiple of cooling hole shapes 402 to provide external support, and thus accurate spacing for each individual cooling hole shape 402. That is, the external fixation 404 facilitates maintenance of cooling hole position by tying together groups of the desired cooling hole shapes 402 and anchoring the desired cooling hole shapes 402 to the shell 202. This may significantly increase accuracy and precision of the cooling holes 170.

In one embodiment, the additively manufactured skeleton core portion 400 is produced with optional finishing steps applied, such as an aluminide coating on the refractory metal. That is, once additively manufactured, the additively manufactured skeleton core portion 400 may be coated or otherwise finished in a manner appropriate for a refractory metal.

As the additively manufactured skeleton core portion 400 with the cooling hole shapes 402 is additively manufactured, the additively manufactured skeleton core portion 400 forms the base of the core 200 that forms internal cooling circuit 110. In one example, the additively manufactured skeleton core portion 400 and the individual cooling hole shapes 402 may provide more than 50% of the volume of the core 200 to facilitate later removal of the relatively less difficult to remove refractory metal material.

Next, the additively manufactured skeleton core portion 400 is fixtured or otherwise precisely located within the bed of an additive manufacturing machine (step 304). The shape of the additively manufactured skeleton core portion 400 is accounted for in the programming of the additive manufacturing machine (step 306). That is, the programming is utilized to facilitate usage of the additively manufactured skeleton core portion 400 as a reference for the additive manufacturing machine. It should be appreciated that in some embodiment, additive manufacturing may be performed on one location of the additively manufactured skeleton core portion 400, then the additively manufactured skeleton core portion 400 is fixtured in another orientation to perform additive manufacturing on another location of the additively manufactured skeleton core portion 400.

Next, an ceramic material fills the bed, and ceramic printing commences upon or adjacent to the refractory metal additively manufactured skeleton core portion 400 to form an surround core portion 410 that is additively manufactured to the additively manufactured skeleton core portion 400 (step 308A; FIG. 8).

The additively manufactured skeleton core portion 400 may be readily manufactured with an additive manufacturing process that includes but are not limited to, Sterolithography (SLA), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Laser Powder Bed Fusion (LPBF) and others. Although particular additive manufacturing processes are disclosed, those skilled in the art of manufacturing will recognize that any other suitable rapid manufacturing methods using layer-by-layer construction or additive fabrication can alternatively be used.

The additive material for the surround core portion 410 may be a material different than that of the additively manufactured skeleton core portion 400. For example, the surround core portion 410 may be manufactured of silica, alumina ceramic, or other such material to define the internal cooling circuit 110. That is, the additively manufactured skeleton core portion 400 may form the bulk of the core 200 while the surround core portion 410 at least partially encapsulates the additively manufactured skeleton core portion 400 to finalize the shape of the internal cooling circuit 110. It should be appreciated that various and/or multiple additively manufactured surround core portions 410 may be formed.

In another disclosed, non-limiting embodiment, the additively manufactured skeleton core portion 400 is inserted into a core die, and a ceramic material is injected around the additively manufactured skeleton core portion 400 while leaving the desired cooling hole shapes 402 exposed (Step 308B). That is, the surround core portion 410 is injection molded rather than additively manufactured. Alternatively, some combination of injection molding is combined with additive manufacturing.

Next, the additively manufactured skeleton core portion 400 and the surround core portion 410 are then fired to complete the core 200 (step 310). That is, the additively manufactured skeleton core portion 400 and the surround core portion 410 are prepared for final disposition of the core 200 within the shell 202 (step 310).

Next, the core 200 is subjected to wax injection and pattern finishing (step 312). Wax injection is the placement of the finished cores plus any quartz rods and support features within the wax die, and injection of the wax around the core which forms the wax pattern. That is, wax pattern finishing is the set of steps to prepare the as-injected wax form for casting, such as wax welding additional features and runners/gates.

Next, a ceramic and aggregate shell is formed upon the outside of the wax pattern mold (step 314). Shelling is typically performed by alternatingly dipping in a wet ceramic slurry and powdering with sand and other agents.

Next, the wax is removed from within the shell, typically using an autoclave, hence the "lost wax" in the investment casting process (step 316) then the shell is fired (step 318). The firing provides for sintering of the shell mold via a high-temperature furnace following drying.

Next, the workpiece is cast and solidified (step 320). The casting is performed via the pouring of a molten alloy into the mold and subsequently controlling the cooling of the alloy between the liquid and solid states, all performed in a vacuum environment.

Next, the shell is removed (step 322). That is, the casting is physically knocked-out of the casting from the shell.

Next, the application of a heat cycle to the casting in a high-temperature furnace is performed to impart molecular and structural changes to the alloy to achieve desired grain results (step 324).

Finally, the core 200 is removed (step 326). As the bulk of the core 200 is the additively manufactured skeleton core portion 400 which is manufactured of a refractory metal, the time required to remove the core 200 is readily effectuated in days rather week were the entirety of the core manufactured of ceramic (step 328).

Additive ceramic core cooling holes are not strong enough to repeatably withstand the casting process. The method 300 increases yield over a core composed entirely of refractory metal, whether additive, machined, or die-cast, which may suffer from production issues such as recrystallization from being over-stiff and not crushable, and leaching of large section areas will take far longer than a ceramic core. Furthermore, refractory metals are much more expensive to be used for large volumes. In addition, the cooling hole shapes 402 eliminates hole drilling costs and improves the metallurgy surrounding cooling holes, versus laser or EDM by eliminating re-cast layers and heat affected zones. The cooling hole shapes 402 also result in a relatively smoother hole finish and shape closer to design intent than EDM or laser hole drilling improves film effectiveness, that may reduce cooling air flow requirements and/or lower part metal temperature. The cooling hole shapes 402 also result in more dependable shape and position of cooling holes than EDM or laser hole drilling can reduce flow variability and either tighten manufacturing tolerances or improve process capability. Also, tying the cooling hole shapes 402 together and/or anchoring to the shell with external fixation as part of the skeleton further improve process capability.

The use of the terms "a," "an," "the," and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other. It should be appreciated that relative positional terms such as "forward," "aft," "upper," "lower," "above," "below," and the like are with reference to normal operational attitude and should not be considered otherwise limiting.

Although the different non-limiting embodiments have specific illustrated components, the embodiments of this invention are not limited to those particular combinations. It is possible to use some of the components or features from any of the non-limiting embodiments in combination with features or components from any of the other non-limiting embodiments.

It should be appreciated that like reference numerals identify corresponding or similar elements throughout the several drawings. It should also be appreciated that although a particular component arrangement is disclosed in the illustrated embodiment, other arrangements will benefit herefrom.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed:

1. A core for use in casting an internal cooling circuit of an airfoil for a gas turbine engine component, the core comprising:

an additively manufactured skeleton core portion manufactured of a first material to at least partially form an internal cooling circuit;

a surround core portion that at least partially encapsulates the additively manufactured skeleton core portion, the surround core portion manufactured of a ceramic material different than the first material and to finalize the internal cooling circuit, wherein the additively manufactured skeleton core portion provides more than 50% of the volume of the core; and a cooling hole shape manufactured of the first material, the cooling hole shape extends from the additively manufactured skeleton core portion through the surround core portion, the cooling hole shape shaped to form a cooling hole in the airfoil.

2. The core as recited in claim 1, wherein the additively manufactured skeleton core portion is manufactured of Molybdenum.

3. The core as recited in claim 1, wherein the additively manufactured skeleton core portion is manufactured of aluminum oxide.

4. The core as recited in claim 1, wherein the additively manufactured skeleton core portion is manufactured of silicon dioxide.

5. The core as recited in claim 1, wherein the surround core portion is additively manufactured onto the additively manufactured skeleton core portion.

6. The core as recited in claim 1, wherein the surround core portion is molded onto the additively manufactured skeleton core portion.

7. The core as recited in claim 1, wherein the cooling hole shape is shaped to form a diffusion region in the cooling hole.

8. The core as recited in claim 1, wherein the additively manufactured skeleton core portion forms the base of the surround core.

9. A method of manufacturing a core for use in casting an internal cooling circuit of an airfoil for a gas turbine engine component, the method comprising:

at least partially encapsulating an additively manufactured skeleton core portion with a surround core portion such that a cooling hole shape manufactured of a first material extends from the additively manufactured skeleton core portion and through the surround core portion, the cooling hole shape shaped to form a cooling hole in the gas turbine engine component, the additively manufactured skeleton core portion manufactured of the first material and the surround core portion manufactured of a ceramic material different than the first material, wherein the additively manufactured skeleton core portion provides more than 50% of the volume of the core; and additively manufacturing an external fixation of the first material to connect at least two cooling hole shapes outside the surround core portion.

10. The method as recited in claim 9, further comprising forming a diffusion region to the cooling hole shape.

11. The method as recited in claim 9, further comprising additively manufacturing the additively manufactured skeleton core portion from Molybdenum.

12. The method as recited in claim 9, further comprising molding the surround core portion.

13. The method as recited in claim 9, further comprising injecting ceramic material into a core die to form the surround core portion.

14. The method as recited in claim 9, further comprising inserting the additively manufactured skeleton core portion into a core die; and injecting a ceramic material around the additively manufactured skeleton core portion while leaving the desired cooling hole shapes exposed.

* * * * *